(12) United States Patent
Backes et al.

(10) Patent No.: US 11,348,832 B2
(45) Date of Patent: *May 31, 2022

(54) SELF-ALIGNED VIA INTERCONNECT STRUCTURES

(71) Applicant: INTERNATIONAL BUSINESS MACHINES CORPORATION, Armonk, NY (US)

(72) Inventors: Benjamin C. Backes, Poughkeepsie, NY (US); Brian A. Cohen, Beacon, NY (US); Joyeeta Nag, Wappingers Falls, NY (US); Carl J. Radens, LaGrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/460,250

(22) Filed: Jul. 2, 2019

(65) Prior Publication Data

US 2019/0326170 A1 Oct. 24, 2019

Related U.S. Application Data

(60) Continuation of application No. 15/070,242, filed on Mar. 15, 2016, now Pat. No. 10,395,984, which is a
(Continued)

(51) Int. Cl.
*H01L 21/768* (2006.01)
*H01L 23/522* (2006.01)
(Continued)

(52) U.S. Cl.
CPC .... *H01L 21/76897* (2013.01); *H01L 21/2885* (2013.01); *H01L 21/31111* (2013.01);
(Continued)

(58) Field of Classification Search
CPC ........... H01L 21/76897; H01L 21/2885; H01L 21/31111; H01L 21/76885; H01L 21/768
See application file for complete search history.

(56) References Cited

U.S. PATENT DOCUMENTS

| 4,764,484 A | 8/1988 | Mo |
| 4,996,133 A | 2/1991 | Brighton et al. |
| (Continued) | | |

OTHER PUBLICATIONS

US 6,368,220 B1, 02/2013, Lu et al. (withdrawn)
(Continued)

*Primary Examiner* — David A Zarneke
(74) *Attorney, Agent, or Firm* — L. Jeffrey Kelly; Andrew M. Calderon; Roberts Calderon Safran & Cole, P.C.

(57) ABSTRACT

A self-aligned via interconnect structures and methods of manufacturing thereof are disclosed. The method includes forming a wiring structure in a dielectric material. The method further includes forming a cap layer over a surface of the wiring structure and the dielectric material. The method further includes forming an opening in the cap layer to expose a portion of the wiring structure. The method further includes selectively growing a metal or metal-alloy via interconnect structure material on the exposed portion of the wiring structure, through the opening in the cap layer. The method further includes forming an upper wiring structure in electrical contact with the metal or metal-alloy via interconnect structure.

20 Claims, 4 Drawing Sheets

Related U.S. Application Data division of application No. 14/563,554, filed on Dec. 8, 2014, now Pat. No. 10,727,122.

(51) Int. Cl.
  *H01L 23/532* (2006.01)
  *H01L 21/288* (2006.01)
  *H01L 21/311* (2006.01)
  *H01L 23/528* (2006.01)

(52) U.S. Cl.
  CPC .. *H01L 21/76802* (2013.01); *H01L 21/76834* (2013.01); *H01L 21/76846* (2013.01); *H01L 21/76849* (2013.01); *H01L 21/76885* (2013.01); *H01L 23/528* (2013.01); *H01L 23/5226* (2013.01); *H01L 23/53209* (2013.01); *H01L 23/53238* (2013.01); *H01L 23/53257* (2013.01); *H01L 23/53295* (2013.01); *H01L 2924/0002* (2013.01)

(56) References Cited

U.S. PATENT DOCUMENTS

| | | | |
|---|---|---|---|
| 5,063,169 A | 11/1991 | De Bruin et al. | |
| 5,783,485 A | 7/1998 | Ong et al. | |
| 6,180,523 B1 | 1/2001 | Lee et al. | |
| 6,245,670 B1 | 6/2001 | Cheung et al. | |
| 6,271,084 B1 | 8/2001 | Tu et al. | |
| 6,326,300 B1 | 12/2001 | Liu et al. | |
| 6,342,733 B1 | 1/2002 | Hu et al. | |
| 6,406,939 B1 | 6/2002 | Lin | |
| 6,440,842 B1 | 8/2002 | Chang | |
| 6,452,276 B1 | 9/2002 | Cohen et al. | |
| 6,551,915 B2 | 4/2003 | Lin et al. | |
| 6,565,785 B1 | 5/2003 | Ishikawa | |
| 6,603,203 B2 | 8/2003 | Amanuma | |
| 6,624,018 B1 | 9/2003 | Yu et al. | |
| 6,876,079 B2 | 4/2005 | Aoyama | |
| 7,045,896 B2 | 5/2006 | Ahn | |
| 7,163,887 B2 | 1/2007 | Kudo et al. | |
| 7,332,813 B2 | 2/2008 | Ueno | |
| 7,339,273 B2 | 3/2008 | Kameyama et al. | |
| 7,381,637 B2 | 6/2008 | Cooney, III et al. | |
| 7,470,619 B1 | 12/2008 | Chen et al. | |
| 7,476,618 B2 | 1/2009 | Kilpela et al. | |
| 7,485,967 B2 | 2/2009 | Kameyama et al. | |
| 7,598,616 B2 | 10/2009 | Yang et al. | |
| 7,732,925 B2 | 6/2010 | Okayama et al. | |
| 7,867,891 B2 | 1/2011 | O'Brien et al. | |
| 7,898,037 B2 | 3/2011 | Chuang et al. | |
| 8,368,220 B2 * | 2/2013 | Lu | H01L 23/5226 257/758 |
| 8,377,722 B2 | 2/2013 | Goulet et al. | |
| 8,409,963 B2 | 4/2013 | Dellis et al. | |
| 8,420,254 B2 | 4/2013 | Zhu et al. | |
| 8,420,438 B2 | 4/2013 | Hynecek et al. | |
| 8,422,295 B1 | 4/2013 | Lin et al. | |
| 8,426,294 B2 | 4/2013 | Lung et al. | |
| 8,427,200 B2 | 4/2013 | Or-Bach | |
| 8,431,480 B2 | 4/2013 | Noguchi et al. | |
| 8,441,038 B1 | 5/2013 | Trimberger | |
| 8,466,269 B2 | 6/2013 | Darzins et al. | |
| RE44,376 E | 7/2013 | Shiau et al. | |
| 8,476,138 B2 | 7/2013 | Chakihara et al. | |
| 8,481,405 B2 | 7/2013 | Arriagada et al. | |
| 8,481,977 B2 | 7/2013 | Beeson et al. | |
| 8,485,418 B2 | 7/2013 | Eldridge et al. | |
| 8,492,168 B2 | 7/2013 | Srinivasan et al. | |
| 8,492,886 B2 | 7/2013 | Or-Bach et al. | |
| 8,501,304 B2 | 8/2013 | Stoykovich et al. | |
| 8,502,979 B2 | 8/2013 | Levy et al. | |
| 8,506,984 B2 | 8/2013 | Cook et al. | |
| 8,513,738 B2 | 8/2013 | Campi, Jr. et al. | |
| 8,535,108 B2 | 9/2013 | Umeda et al. | |
| 8,536,058 B2 | 9/2013 | Kostamo et al. | |
| 8,536,497 B2 | 9/2013 | Kim | |
| 8,541,176 B2 | 9/2013 | Pamula et al. | |
| 8,541,819 B1 | 9/2013 | Or-Bach et al. | |
| 8,552,571 B2 | 10/2013 | Hosseini et al. | |
| 8,557,272 B2 | 10/2013 | Zhao | |
| 8,557,632 B1 | 10/2013 | Or-Bach et al. | |
| 8,562,078 B2 | 10/2013 | Burns et al. | |
| 8,563,396 B2 | 10/2013 | Purushothaman et al. | |
| 8,563,501 B2 | 10/2013 | Wagner et al. | |
| 8,564,575 B2 | 10/2013 | Yamazaki et al. | |
| 8,569,810 B2 | 10/2013 | Yu et al. | |
| 8,569,946 B2 | 10/2013 | Song et al. | |
| 8,574,615 B2 | 11/2013 | Tenney et al. | |
| 8,574,929 B1 | 11/2013 | Or-Bach et al. | |
| 8,575,021 B2 | 11/2013 | Boussie et al. | |
| 8,581,398 B2 | 11/2013 | Arriagada et al. | |
| 8,584,703 B2 | 11/2013 | Kobrin et al. | |
| 8,585,753 B2 | 11/2013 | Scanlon et al. | |
| 8,586,473 B1 | 11/2013 | Tanwar et al. | |
| 8,610,099 B2 | 12/2013 | Vereen et al. | |
| 8,611,142 B2 | 12/2013 | Nakamura et al. | |
| 8,613,889 B2 | 12/2013 | Pollack et al. | |
| 8,614,145 B2 | 12/2013 | Hummler | |
| 8,617,190 B2 | 12/2013 | Gifford, III et al. | |
| 8,617,981 B2 | 12/2013 | Noguchi et al. | |
| 8,618,221 B2 | 12/2013 | Nealey et al. | |
| 8,618,795 B1 | 12/2013 | Nagarkar et al. | |
| 8,623,758 B1 | 1/2014 | Ryan et al. | |
| 8,636,323 B2 | 1/2014 | Prince-Wright et al. | |
| 8,642,416 B2 | 2/2014 | Or-Bach et al. | |
| 8,649,127 B2 | 2/2014 | Fuji et al. | |
| 8,652,962 B2 | 2/2014 | Singh et al. | |
| 8,659,944 B2 | 2/2014 | Hung et al. | |
| 8,664,042 B2 | 3/2014 | Or-Bach et al. | |
| 8,669,176 B1 | 3/2014 | Tanwar | |
| 8,669,778 B1 | 3/2014 | Or-Bach et al. | |
| 8,674,470 B1 | 3/2014 | Or-Bach et al. | |
| 8,679,587 B2 | 3/2014 | Chang et al. | |
| 8,685,215 B2 | 4/2014 | Miller et al. | |
| 8,686,428 B1 | 4/2014 | Sekar et al. | |
| 8,703,597 B1 | 4/2014 | Sekar et al. | |
| 8,709,880 B2 | 4/2014 | Or-Bach et al. | |
| 8,710,500 B2 | 4/2014 | Chan et al. | |
| 8,742,086 B2 | 6/2014 | Darzins et al. | |
| 8,742,249 B2 | 6/2014 | Moslehi | |
| 8,742,476 B1 | 6/2014 | Or-Bach et al. | |
| 8,749,057 B2 | 6/2014 | Goulet et al. | |
| 8,754,533 B2 | 6/2014 | Or-Bach et al. | |
| 8,759,976 B2 | 6/2014 | Edelstein et al. | |
| 8,766,372 B2 | 7/2014 | Kuhn et al. | |
| 8,790,966 B2 | 7/2014 | Zhang et al. | |
| 8,803,206 B1 | 8/2014 | Or-Bach et al. | |
| 8,896,068 B2 | 11/2014 | Mayuzumi | |
| 8,921,150 B2 | 12/2014 | Lu et al. | |
| 9,123,785 B1 | 9/2015 | Duong et al. | |
| 9,397,045 B2 | 7/2016 | Peng et al. | |
| 9,514,983 B2 | 12/2016 | Jezewski et al. | |
| 10,128,184 B2 | 11/2018 | Li et al. | |
| 2001/0038115 A1 | 11/2001 | Amanuma | |
| 2001/0045662 A1 | 11/2001 | Kajita et al. | |
| 2002/0013045 A1 | 1/2002 | Palmans et al. | |
| 2002/0058405 A1 | 5/2002 | Huang et al. | |
| 2002/0106887 A1 | 8/2002 | Chang | |
| 2003/0008497 A1 | 1/2003 | Lin et al. | |
| 2003/0071355 A1 | 4/2003 | Dubin et al. | |
| 2005/0170632 A1 | 8/2005 | Shim | |
| 2005/0245068 A1 | 11/2005 | Gambino et al. | |
| 2006/0211235 A1 | 9/2006 | Usami | |
| 2008/0024614 A1 | 1/2008 | Li et al. | |
| 2008/0061403 A1 | 3/2008 | He et al. | |
| 2008/0064221 A1 | 3/2008 | Han et al. | |
| 2008/0081466 A1 | 4/2008 | Matsuo et al. | |
| 2008/0197499 A1 | 8/2008 | Yang et al. | |
| 2008/0246148 A1 | 10/2008 | Won et al. | |
| 2008/0308944 A1 | 12/2008 | XiangHui et al. | |
| 2009/0026659 A1 | 1/2009 | Vontell, Sr. et al. | |
| 2009/0184400 A1 | 7/2009 | Chen et al. | |
| 2009/0250815 A1 | 10/2009 | Yang et al. | |

(56) References Cited

U.S. PATENT DOCUMENTS

| | | | |
|---|---|---|---|
| 2009/0266590 A1* | 10/2009 | Aoi | H01L 23/53276 174/257 |
| 2009/0278228 A1 | 11/2009 | Hsu et al. | |
| 2009/0302477 A1 | 12/2009 | Shor et al. | |
| 2010/0261345 A1 | 10/2010 | Na | |
| 2010/0295188 A1 | 11/2010 | Han et al. | |
| 2010/0327445 A1 | 12/2010 | Filippi et al. | |
| 2011/0042752 A1 | 2/2011 | Mayuzumi | |
| 2011/0163449 A1 | 7/2011 | Kelly et al. | |
| 2011/0193085 A1 | 8/2011 | Goulet et al. | |
| 2012/0142188 A1 | 6/2012 | Lu et al. | |
| 2012/0153483 A1 | 6/2012 | Akolkar et al. | |
| 2013/0015581 A1 | 1/2013 | Wann et al. | |
| 2013/0043591 A1 | 2/2013 | Yang et al. | |
| 2013/0082393 A1 | 4/2013 | Kawamura | |
| 2014/0183738 A1 | 7/2014 | Jezewski et al. | |
| 2014/0264926 A1 | 9/2014 | Wu et al. | |
| 2015/0270215 A1 | 9/2015 | Peng et al. | |
| 2016/0163587 A1 | 6/2016 | Backes et al. | |
| 2016/0197013 A1 | 7/2016 | Backes et al. | |
| 2016/0197038 A1 | 7/2016 | Backes et al. | |

OTHER PUBLICATIONS

Notice of Allowance dated Mar. 17, 2020 in related U.S. Appl. No. 14/563,554, 9 pages.
"List of IBM Patents or Patent Applications Treated as Related" 1 page, dated Jul. 2, 2019.
Office Action dated Jul. 3, 2019 in related U.S. Appl. No. 14/563,554, 21 pages.
Final Office Action dated Nov. 20, 2019 in related U.S. Appl. No. 14/563,554, 21 pages.
Office Action dated Mar. 30, 2021 in related U.S. Appl. No. 15/070,231, 15 pages.
Final Office Action dated Jul. 21, 2021 in related U.S. Appl. No. 15/070,231, 17 pages.

* cited by examiner

SELF-ALIGNED VIA INTERCONNECT STRUCTURES

FIELD OF THE INVENTION

The invention relates to semiconductor structures and, more particularly, to self-aligned via interconnect structures and methods of manufacturing thereof.

BACKGROUND

Scaling of semiconductor devices is becoming ever more difficult in sub-22 nm technologies. For example, as structures continue to scale downward, via contact resistance becomes a performance limiting factor; that is, the via contact resistance becomes very high, particularly in back end of the line (BEOL) via interconnect structures.

By way of example, dual-damascene fill processes require PVD liner/barrier deposition. Due to the line width requirements in scaled technologies, e.g., sub 22 nm, the liner/barrier deposition will displace the primary conductor. As the PVD liner/barrier materials, e.g., TaN and Ta, have higher resistance than the primary conductors, e.g., Cu, dual-damascene fill processes have become a major contributor to increased contact resistance. This increased contact resistance, in turn, leads to decreased performance of the semiconductor device.

Also, as process technologies continue to shrink towards 14-nanometers (nm) and beyond, it is becoming difficult to build self-aligned fine pitch vias with current lithography processes. This is mainly due to the size of the underlying wiring lines, e.g., width of the underling wiring structure, as well as current capabilities of lithography tool optics for 32 nm and smaller dimension technologies.

SUMMARY

In an aspect of the invention, a method includes forming a wiring structure in a dielectric material. The method further includes forming a cap layer over a surface of the wiring structure and the dielectric material. The method further includes forming an opening in the cap layer to expose a portion of the wiring structure. The method further includes selectively growing a metal or metal-alloy via interconnect structure material on the exposed portion of the wiring structure, through the opening in the cap layer. The method further includes forming an upper wiring structure in electrical contact with the metal or metal-alloy via interconnect structure.

In an aspect of the invention, a method includes: forming a wiring structure within a dielectric material; forming a dielectric masking layer over the wiring structure and the dielectric material; forming an opening in the dielectric masking layer, exposing a portion of the wiring structure; overfilling the opening with metal or metal-alloy material to form a via interconnect structure in direct electrical contact with the wiring structure; and forming an upper wiring structure in electrical contact with the via interconnect structure, within a trench formed in an upper dielectric material.

In an aspect of the invention, a method includes: forming a wiring structure in a dielectric layer; depositing a dielectric cap layer over the wiring structure and the dielectric layer; etching an opening in the dielectric layer, exposing a surface of the wiring structure; forming a self-aligned via interconnect structure in direct electrical contact with the metal material of the wiring structure by overfilling the opening with a metal or metal-alloy growth process; depositing an interlevel dielectric material over the self-aligned via interconnect structure and the dielectric cap layer; etching a trench within the interlevel dielectric material to expose one or more surfaces of the self-aligned via interconnect structure; depositing a barrier material and liner material over the exposed one or more surfaces of the self-aligned via interconnect structure and on sidewalls of the trench; and electroplating a metal or metal-alloy material on the liner material to complete formation of an upper wiring structure, in electrical contact with the via interconnect structure.

In an aspect of the invention, a structure includes a self-aligned cobalt interconnect structure between and in electrical contact with an upper wiring layer and a lower wiring layer. The self-aligned cobalt interconnect structure is an overgrowth of cobalt within an opening of a dielectric cap material on the lower wiring layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1, 2*a* and 2*b*-6 show structures and respective processing steps in accordance with aspects of the present invention.

DETAILED DESCRIPTION

The invention relates to semiconductor structures and, more particularly, to self-aligned via interconnect structures and methods of manufacturing thereof. More specifically, the present invention relates to self-aligned inverted via interconnect structures formed with selective CVD cobalt processes, which are self-aligned to underlying metal wiring structures. In embodiments, the self-aligned inverted via interconnect, e.g., cobalt via, is formed between an upper copper wiring structure and a lower copper wiring structure; although, other materials are also contemplated for use with the wiring structures. In embodiments, the self-aligned inverted via interconnect structure can be deposited by a selective metal growth process formed through a via in a dielectric cap layer formed over the upper wiring structure. In embodiments, the selective metal growth process is a selective cobalt growth process, which overfills the opening in the dielectric cap layer and can even be allowed to grow laterally on the surface of the dielectric cap layer.

In embodiments, the self-aligned inverted via interconnect structure introduces minimal interfacial resistance to the underlying wiring level. This is due to the fact that the self-aligned inverted via interconnect structure does not require a barrier material and a liner material at the interface with the underlying wiring structure. That is, by using the self-aligned inverted via interconnect structure, it is now possible to eliminate the liner/barrier interface between the via and underlying wire structure. Moreover, the self-aligned inverted via interconnect structure does not displace any primary conductive material in a via and, in fact, increases a contact area with an upper wiring structure, hence reducing the interfacial resistance with the upper wiring structure.

The self-aligned inverted via interconnect structure can be manufactured in a number of ways using a number of different tools. In general, though, the methodologies and tools are used to form structures with dimensions in the micrometer and nanometer scale. The methodologies, i.e., technologies, employed to manufacture the optimized wires have been adopted from integrated circuit (IC) technology. For example, the structures, e.g., self-aligned inverted via interconnect structure, are built on wafers and are realized in films of material patterned by photolithographic processes on the top of a wafer. In particular, the fabrication of the self-aligned inverted via interconnect structure uses three basic building blocks: (i) deposition of thin films of material on a substrate, (ii) applying a patterned mask on top of the films by photolithographic imaging, and (iii) etching the films selectively to the mask.

Figure 1:
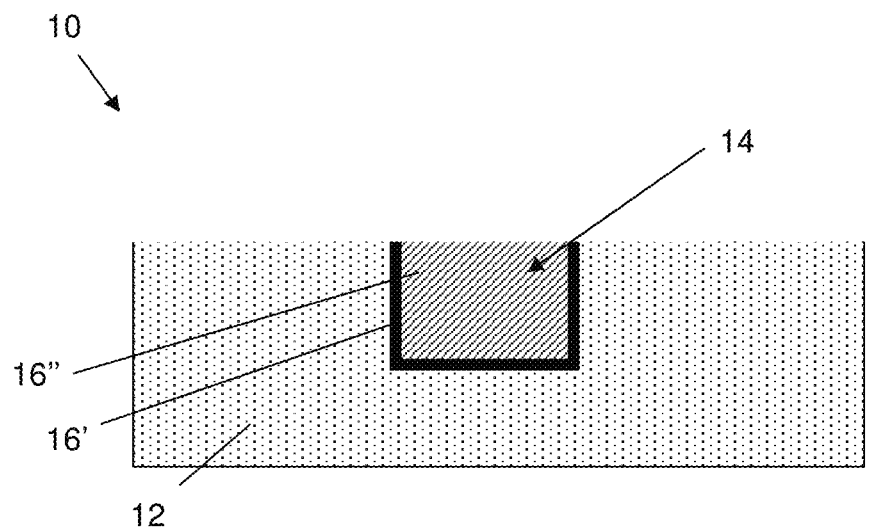

FIG. 1 shows a structure and respective processing steps in accordance with aspects of the present invention. In particular, FIG. 1 shows a structure 10 comprising an interlevel dielectric layer 12. In embodiments, the interlevel dielectric layer 12 can be, for example, an oxide material or other low-k dielectric material. A wiring structure 14 is formed within the dielectric layer 12 using conventional lithography, etching and deposition processes. For example, the formation of the wiring structure 14 begins with the deposition and patterning of a resist on the interlevel dielectric layer 12. The resist patterned by exposure to energy (light) to form a pattern (openings), which corresponds to the dimensions of the wiring structure 14. A reactive ion etching (RIE) process is performed through the resist pattern to form a trench. The resist can then be removed using conventional etchants and/or stripping techniques, e.g., oxygen ashing.

A barrier/liner material 16' is formed within the opening. In embodiments, the barrier/liner material 16' can be a combination of a barrier metal or metal alloy material and a liner metal or metal alloy material. In embodiments, the barrier/liner material 16' is deposited using either plasma vapor deposition (PVD), chemical vapor deposition (CVD) or atomic layer deposition (ALD) processes. The PVD process provides a dense layer of barrier/liner material 16', thus providing significantly improved barrier performance due to increased barrier density. Specifically, compared to CVD or ALD processes, in PVD processes, the copper fill will not leak into the interlevel dielectric layer thereby preventing time-dependent dielectric breakdown TDDB. Also, due to the increased barrier density, oxygen will not leak into the copper fill thereby decreasing interconnect resistance and increasing via interconnect and wiring structure lifetime.

In embodiments, the barrier material can be TaN or TiN with the liner material being Ta or Ti, respectively, or Co. A seed layer is deposited on the barrier/liner material 16' followed by a deposition of wiring metal to form the wiring structure 14. By way of example, a seed layer of copper can be deposited using a PVD process, followed by an electroplating of copper material (both of represented at reference numeral 16"). In embodiments, other metal materials can also be used for the wiring structure 14.

Still referring to FIG. 1, any residual barrier/liner material 16' and wiring material 16" can be removed from the upper surface of the interlevel dielectric layer 12 using a chemical mechanical polishing (CMP) process. The CMP process will also planarize the wiring structure 14 and the interlevel dielectric layer 12, for subsequent processing.

Figure 2A:
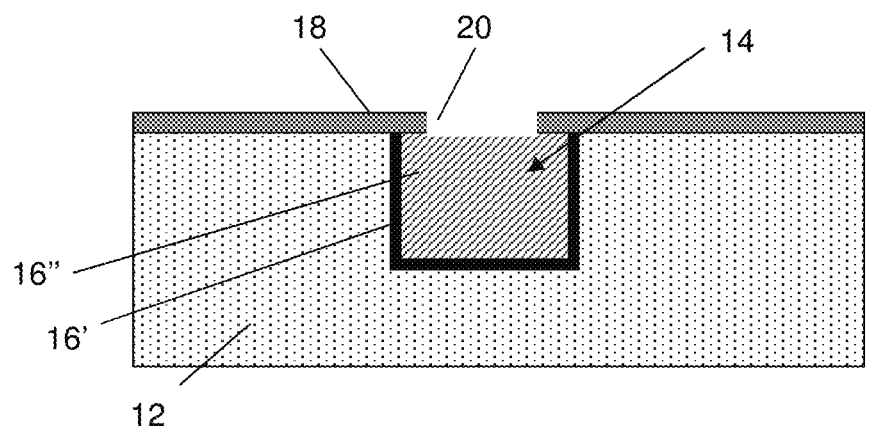
Figure 2B:
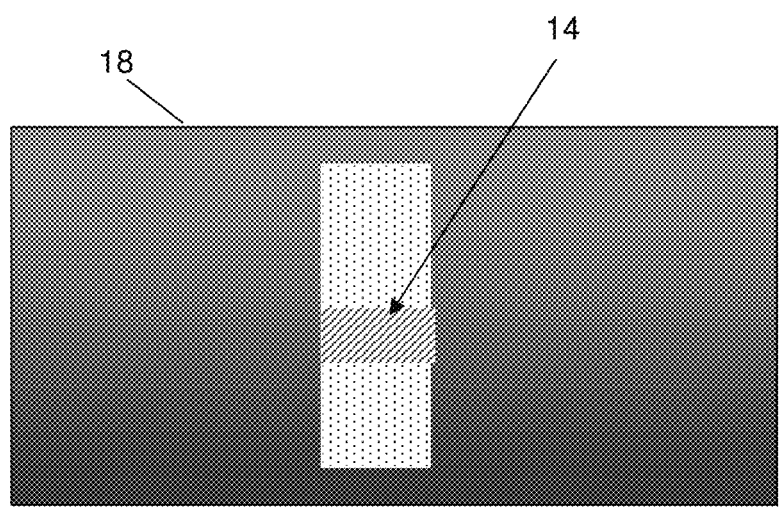

FIG. 2a shows a cross sectional view of a structure and respective processing steps in accordance with aspects of the present invention; whereas, FIG. 2b shows a top down view of the structure of FIG. 2a. In both of these views, a cap layer 18 is shown deposited on the planarized surface of the wiring structure 14 and the interlevel dielectric layer 12. In FIG. 2b, the cap layer 18 is represented in a partial transparent view to show the underlying structures, e.g., wiring structure 14 and the interlevel dielectric layer 12, for descriptive purposes only.

In embodiments, the cap layer 18 is a thin dielectric hard mask layer of, e.g., SiN or SiNC; although other capping materials are also contemplated by the present invention. The thin dielectric hard mask layer can have a thickness of about 25 nm or less, by way of one non-limiting illustrative example. In embodiments, the cap layer 18 can be deposited using a conventional chemical vapor deposition (CVD) process. An opening 20 is formed in the cap layer 18 using conventional lithography and etching processes, e.g., a wet etching process. As shown in FIG. 2b, the opening 20 crosses over the wiring structure 14 in order to expose a surface thereof. In embodiments, the opening 20 can be a slot pattern, crossing over a segment of the underlying wiring structure 14 to expose a portion thereof for further processing. By way of further example, the slot 20 can be formed orthogonal to the underlying wiring structure 14. In this way, subsequently formed structures, e.g., via and wiring structure, can be self-aligned with the underlying wiring structure 14.

Figure 3:
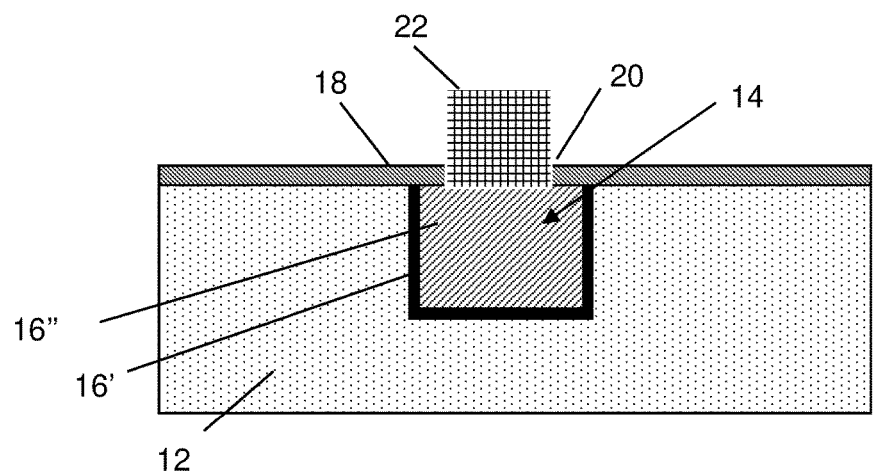

In FIG. 3, the exposed surface of the wiring structure 14 undergoes a cleaning process, prior to a selective CVD Co growth. More specifically, in embodiments, the exposed surface of the wiring structure 14 is cleaned with a hydrogen plasma process to remove any oxide that formed on the surface of the wiring structure 14 when exposed to air, e.g., after the wet etching process. After the cleaning process to remove oxide, a selective CVD Co growth process overfills the opening 20, which is in direct electrical contact with the exposed metal surface of the wiring structure 14. The selective CVD Co growth process will overfill the opening 20, forming a self-aligned inverted via interconnect structure 22. In embodiments, the selective CVD Co growth will not nucleate on the interlevel dielectric layer 12 or the cap layer 18.

By utilizing the processes described herein, it is no longer necessary to form a barrier/liner material at the interface between the wiring structure 14 and the self-aligned inverted via interconnect structure 22. By not using the barrier/liner material, the structure, e.g., self-aligned inverted via interconnect structure 22 and underlying metal wiring structure, will exhibit decreased contact resistance. Also, advantageously, the self-aligned inverted via interconnect structure 22 can be used to prevent electromigration, e.g., the transport of material caused by the gradual movement of ions in a conductor due to the momentum transfer between conducting electrons and diffusing metal atoms. In fact, the self-aligned inverted via interconnect structure 22 can prevent two types of failure modes for via interconnect structures and wiring structures: (i) via depletion; and (ii) line depletion. Via depletion occurs when electrons flow from a wiring line below into the via interconnect structure above. On the other hand, line depletion occurs when electrons flow from the via interconnect structure down to the wiring line below.

Figure 4:
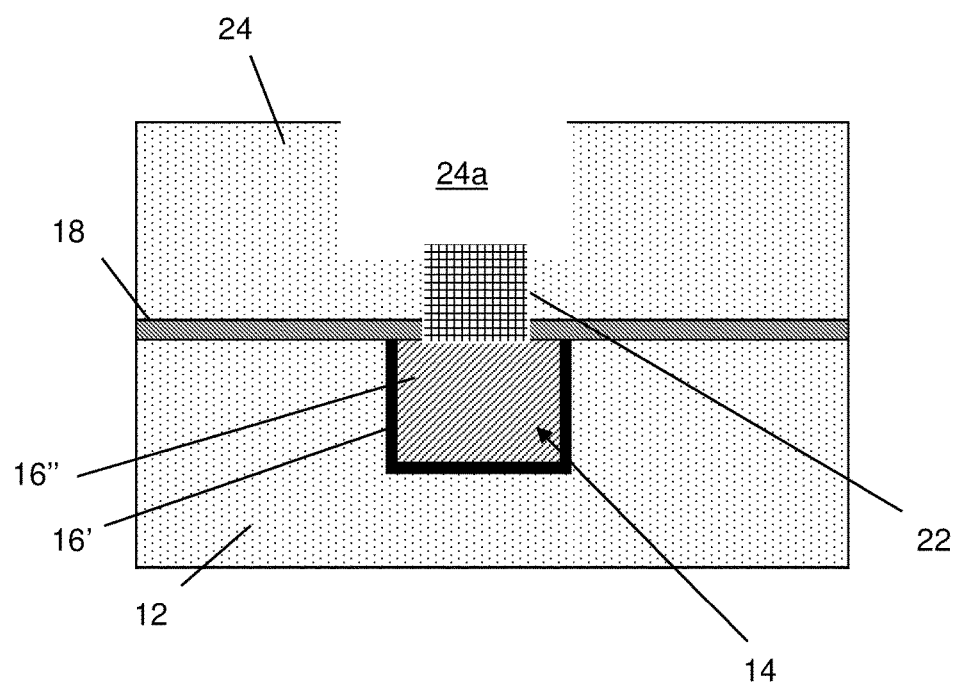

In FIG. 4, an interlevel dielectric material 24 is deposited on the self-aligned inverted via interconnect structure 22 and the cap layer 18. In embodiments, the interlevel dielectric material 24 can be an oxide material deposited using a conventional CVD process. An opening (trench) 24a is formed in the interlevel dielectric material 24, exposing one or more surfaces of the self-aligned inverted via interconnect structure 22. Depending on the designed contact resistance, the opening (trench) 24a can be formed at different depths, exposing more or less surface area of the self-aligned inverted via interconnect structure 22 as shown representatively in both FIG. 4 and FIG. 7, in order to adjust the surface contact resistance between the self-aligned inverted via interconnect structure 22 and an upper wiring structure. In embodiments, the opening (trench) 24a is formed using conventional lithography and etching processes, as described herein.

Figure 5:
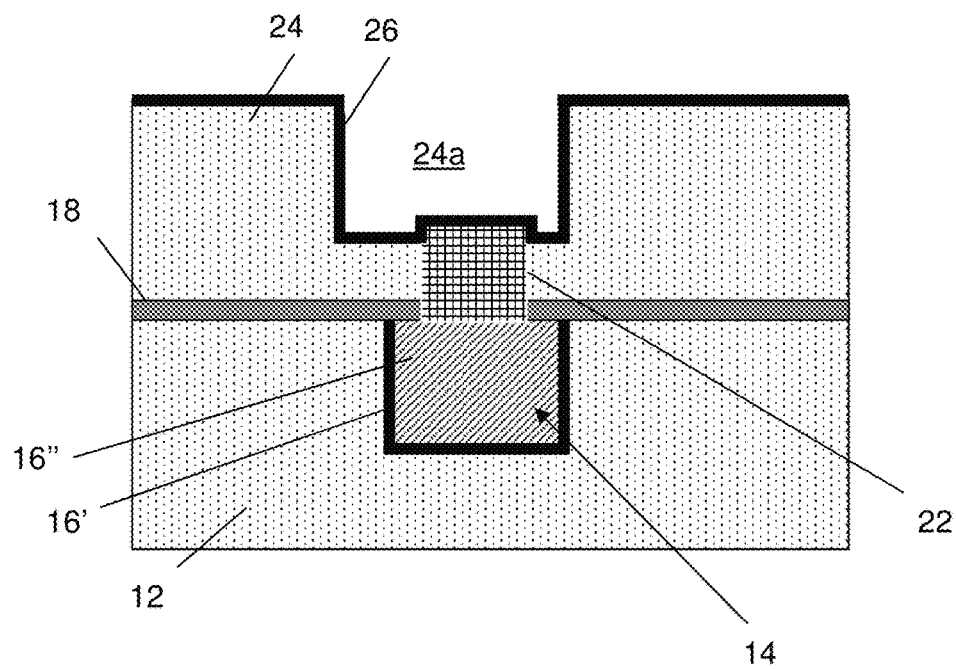

In FIG. 5, following the formation of the opening (trench) 24a, barrier/liner material 26 is formed on the surfaces of the interlevel dielectric material 24, in addition to any exposed surfaces of the self-aligned inverted via interconnect structure 22 within the opening (trench) 24a. In embodiments, the barrier/liner material 26 can be a combination of a barrier material and a liner material. For example, the barrier material can be TaN or TiN with the liner material being Ta, Ti or Co, respectively. In embodiments, the barrier/liner material 26 can be deposited on exposed surfaces of the self-aligned inverted via interconnect structure 22 and surfaces of the interlevel dielectric material 24 (including sidewalls of the opening (trench) 24a, using a conventional PVD process.

Figure 6:
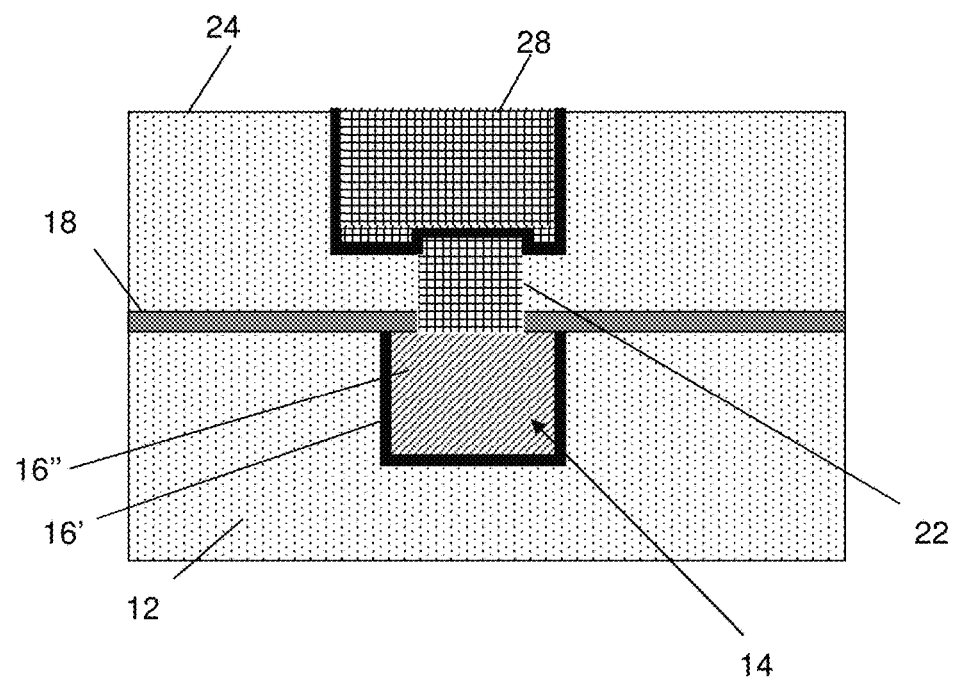

In FIG. 6, an upper wiring structure 28 is formed in direct contact with the barrier/liner material 26 and hence in electrical contact with the self-aligned inverted via interconnect structure 22 within the opening (trench) 24a. In embodiments, the upper wiring structure 28 is formed by a deposition of a seed layer, followed by an electroplating process for the remaining portions of the wiring structure 28. By way of more specific example, a seed layer of copper is deposited using a PVD process, followed by an electroplating of copper material (both represented at reference numeral 28). In embodiments, other metal materials can also be used for the upper wiring structure 28. Any residual barrier/liner material 26 and wiring material of the wiring structure 28 can be removed from the upper surface of the interlevel dielectric layer 24 using a chemical mechanical polishing (CMP) process. The CMP process will also planarize the material of the wiring structure 28 and the interlevel dielectric layer 24, for subsequent processing.

In this way, the upper wiring structure 28 is self-aligned with the self-aligned inverted via interconnect structure 22, with an increased contact surface area (compared to conventional structures). This increased contact surface area will reduce the interfacial resistance with the upper wiring structure 28 (i.e., an inverted via-gouging approach). Also, the barrier/liner material 26 at the interface between the wiring structure 28 and the self-aligned inverted via interconnect structure 22 will minimize electromigration. Moreover, the surface contact areas can be adjusted by forming a deeper opening (trench) 24a as described with respect to FIG. 7.

Figure 7:
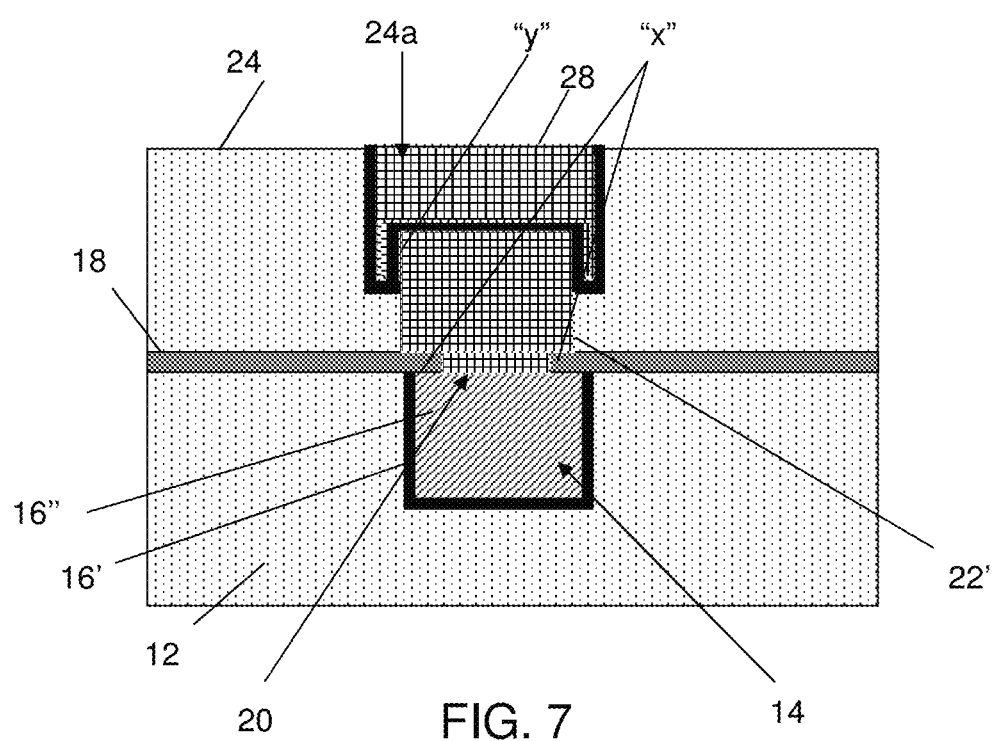
FIG. 7 shows an alternative structure and respective processing steps in accordance with aspects of the present invention.

FIG. 7 shows an alternative structure and respective fabrication processes in accordance with aspects of the invention. In FIG. 7, the self-aligned inverted via interconnect structure 22' is shown to be overgrown, e.g., larger than the opening 20. For example, the self-aligned inverted via interconnect structure 22' can be formed by a lateral overgrowth of the cobalt onto edges of the opening 20, on the cap layer 18, e.g., the cobalt overlaps onto the cap layer 18 by "x" distance on one or both sides. In embodiments, distance "x" can equal any overlap of the upper wiring structure 28, thereby effectively increasing the contact area between the self-aligned inverted via interconnect structure 22' and the upper wiring structure 28. This increased contact surface area, in turn, will decrease the contact resistance of the structure.

Also, by adjusting the depth of the opening (trench) 24a, a contact area between the wiring structure 28 and the self-aligned inverted via interconnect structure 22 can be increased. For example, as further shown in FIG. 7, the opening 24a can be deeper than shown in FIG. 6, for example, to expose more surface area of the self-aligned inverted via interconnect structure 22' (as represented by dimension "y"). This deeper opening 24a will also effectively increase the contact surface area between the self-aligned inverted via interconnect structure 22' and the upper wiring structure 28, hence decreasing the resistance of the structure (i.e., inverted via-gouging).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming a trench in an interlevel dielectric material;
   forming a wiring structure within the trench, comprising:
      forming a barrier material on sidewalls of the trench;
      forming a metal material in remaining portions of the trench, directly on the barrier material; and
      removing any of the barrier material and metal material from an upper surface of the interlevel dielectric material, outside of the trench, the removing of the metal material also planarizes the wiring structure;
   depositing a dielectric cap layer directly contacting and over both the wiring structure and interlevel dielectric material;
   exposing a portion of the wiring structure by etching an opening in the dielectric cap such that the dielectric cap still remains over the barrier material on sidewalls of the trench and on at least one of side of the metal material of the wiring structure;
   forming a self-aligned via interconnect structure in direct electrical contact with the metal material of the wiring structure by overfilling the opening with a metal using a metal growth process such that the metal directly contacts the wiring structure and the overfilling of the metal of the self-aligned via interconnect structure includes an overhang of metal which directly contacts a top surface of the dielectric cap;

depositing an interlevel dielectric material over the self-aligned via interconnect structure and the dielectric cap;

etching a trench within the interlevel dielectric material to expose multiple surfaces of the metal of the self-aligned via interconnect structure;

depositing a barrier material and liner material directly on sidewalls of the trench and on the multiple surfaces of the metal of the self-aligned via interconnect structure; and electroplating another metal material on the liner material to form an upper wiring structure in electrical contact with the self-aligned via interconnect structure.

2. The method of claim 1, wherein the metal growth process is a selective cobalt growth process which overfills the opening with cobalt.

3. The method of claim 2, wherein the selective cobalt growth process laterally overgrows onto edges of the opening.

4. The method of claim 3, wherein the selective cobalt growth process forms the self-aligned via interconnect structure onto a surface of the dielectric cap.

5. The method of claim 4, wherein the self-aligned via interconnect structure is cobalt.

6. The method of claim 1, wherein the upper wiring structure is formed to overlap at least one side of the self-aligned via interconnect structure.

7. The method of claim 1, wherein the upper wiring structure is formed to overlap sides of the self-aligned via interconnect structure.

8. The method of claim 1, wherein an interface between the self-aligned via interconnect structure and the wiring structure is devoid of the barrier material and liner material.

9. The method of claim 1, wherein the etching of the trench within the interlevel dielectric material extends beyond an upper portion of the self-aligned via interconnect structure.

10. The method of claim 1, wherein the depositing the dielectric cap comprises a deposition of a dielectric masking material.

11. The method of claim 1, wherein the etching of the opening in the dielectric cap comprises forming a slot which exposes a portion of the wiring structure.

12. The method of claim 11, wherein the slot is formed orthogonal to the wiring structure.

13. The method of claim 11, wherein a contact region between the self-aligned via interconnect structure and a portion of the dielectric cap is devoid of the barrier material and liner material.

14. The method of claim 1, wherein the multiple surfaces of the self-aligned via interconnect structure comprises a top surface and side surfaces.

15. The method of claim 1, wherein the another metal is electroplated within the trench of the interlevel dielectric material.

16. The method of claim 15, wherein the barrier and liner material are further formed on a surface of the interlevel dielectric material outside of the trench.

17. The method of claim 16, further comprising removing the barrier and liner material and residue of the metal material from the surface of the interlevel dielectric material outside of the trench.

18. The method of claim 15, wherein the metal material is formed in direct contact with the barrier material on the sidewalls of the trench and the multiple surfaces of the self-aligned via interconnect structure.

19. The method of claim 1, wherein the overfilling of the metal of the self-aligned via interconnect structure comprises a lateral overgrowth of cobalt material onto edges of the opening and directly on the dielectric cap layer by "x" distance on one or both sides.

20. The method of claim 19, wherein the "x" distance is equal to an overlap of the upper wiring structure in electrical contact with the self-aligned via interconnect structure.

* * * * *